US010056280B2

United States Patent
Ryu et al.

(10) Patent No.: US 10,056,280 B2
(45) Date of Patent: Aug. 21, 2018

(54) TRANSPORTING SYSTEM AND TRANSPORTING UNIT INCLUDED THEREIN

(71) Applicant: SAMSUNG DISPLAY CO., LTD., Yongin-si, Gyeonggi-Do (KR)

(72) Inventors: Kun-Jin Ryu, Yongin-si (KR); Hyun-Min Lee, Suwon-si (KR); Youn-Boo Jung, Suwon-si (KR); Sung-Hyun Jo, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/711,160

(22) Filed: Sep. 21, 2017

(65) Prior Publication Data

US 2018/0012783 A1    Jan. 11, 2018

Related U.S. Application Data

(63) Continuation of application No. 15/155,578, filed on May 16, 2016, now Pat. No. 9,793,147.

(30) Foreign Application Priority Data

Sep. 9, 2015    (KR) .................. 10-2015-0127766

(51) Int. Cl.
 *B65G 43/00*  (2006.01)
 *H01L 21/677*  (2006.01)
 *G05D 1/02*  (2006.01)

(52) U.S. Cl.
 CPC ......... *H01L 21/67715* (2013.01); *G05D 1/02* (2013.01)

(58) Field of Classification Search
 CPC ........... B61B 13/00; G05D 1/02; B65G 41/02
 (Continued)

(56) References Cited

U.S. PATENT DOCUMENTS

| 6,622,127 B1 * | 9/2003 | Klots | G06F 17/30902 |
| | | | 705/22 |
| 7,412,311 B2 * | 8/2008 | Georgi | A61G 5/043 |
| | | | 318/580 |

(Continued)

FOREIGN PATENT DOCUMENTS

| EP | 00557962 | 2/1995 |
| JP | 06-238380 | 9/1993 |

(Continued)

*Primary Examiner* — Gene O Crawford
*Assistant Examiner* — Lester III Rushin
(74) *Attorney, Agent, or Firm* — F. Chau & Associates, LLC

(57) ABSTRACT

A transporting system includes a first rail including a first region and a second region, the first region being a region where the first rail extends linearly and the second region being a region where the first rail is curved. A second rail includes a third region, separated from the first region, and a fourth region overlapping the second region, wherein the first and second rails merge at a joining location that includes the second region and the fourth region. Optical lines are disposed in the second region and the fourth region, wherein the optical lines are parallel to each other in the fourth region. A first transporting unit travels on the first rail. A second transporting unit travels on the second rail. A first controller controls the traveling of the first and second transporting units using light transmitted or received through the optical lines.

19 Claims, 12 Drawing Sheets

(58) Field of Classification Search
USPC ...... 198/463.1, 444, 464.1, 464.3, 571, 572, 198/357
See application file for complete search history.

(56) References Cited

U.S. PATENT DOCUMENTS

| | | |
|---|---|---|
| 8,061,506 B2 | 11/2011 | Schafer |
| 8,104,722 B2 | 1/2012 | Onishi |
| 8,639,380 B1 | 1/2014 | Lund |
| 8,768,545 B2 | 7/2014 | Ikeya |
| 9,049,313 B2 * | 6/2015 | Mukaibara .......... H04N 1/00031 |
| 9,091,415 B2 * | 7/2015 | Bessho .............. H01L 51/5262 |
| 9,768,878 B2 * | 9/2017 | Vassilieva ............ H04B 10/564 |
| 2015/0030299 A1 | 1/2015 | Chan et al. |
| 2017/0066599 A1 | 3/2017 | Ryu et al. |

FOREIGN PATENT DOCUMENTS

| | | |
|---|---|---|
| JP | 06-102931 | 4/1994 |
| JP | 2001-249718 | 9/2001 |
| JP | 2002-351543 | 12/2002 |
| JP | 2005-115590 | 4/2005 |
| JP | 2006-048333 | 2/2006 |
| JP | 2010-015231 | 1/2010 |
| JP | 2010-202314 | 9/2010 |
| KR | 101440569 | 9/2014 |

* cited by examiner

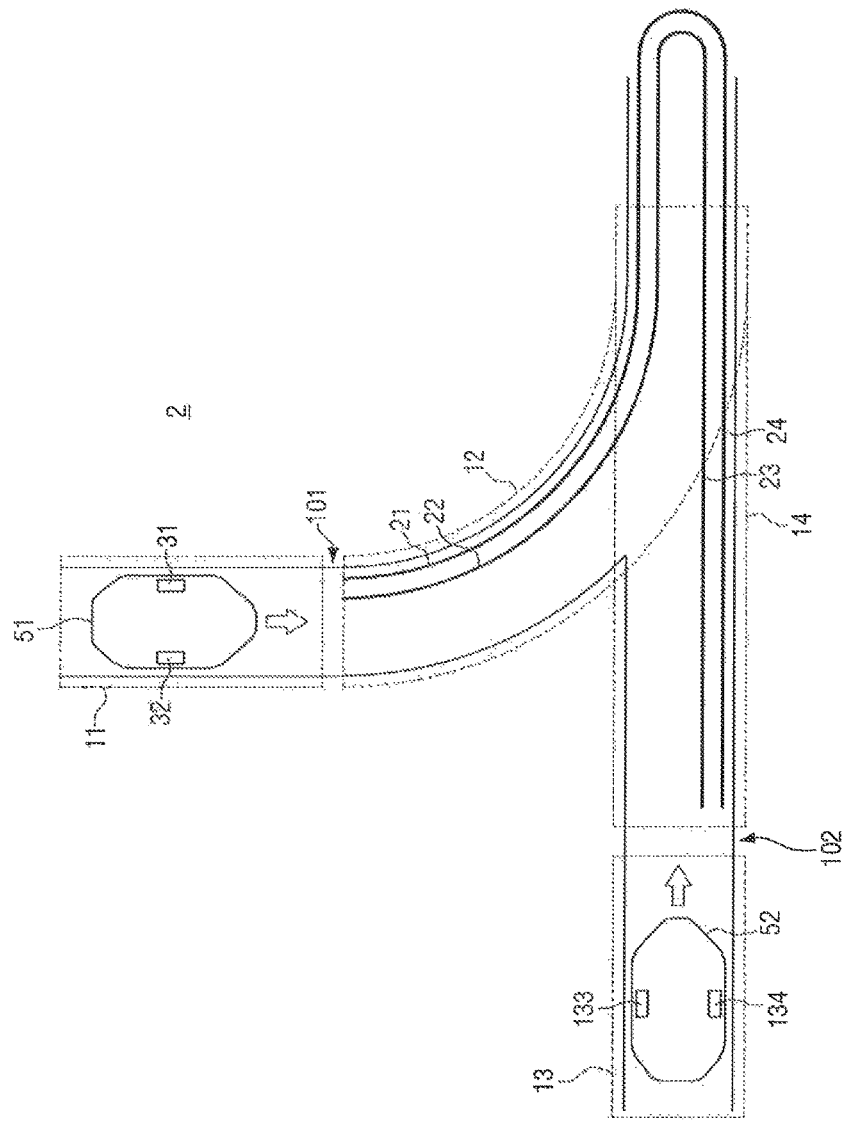

TRANSPORTING SYSTEM AND TRANSPORTING UNIT INCLUDED THEREIN

CROSS-REFERENCE TO RELATED APPLICATION

This application is a Continuation of U.S. patent application Ser. No. 15/155,578, filed on May 16, 2016, which claims priority under 35 U.S.C. § 119 to Korean Patent Application No. 10-2015-0127766, filed on Sep. 9, 2015, in the Korean Intellectual Property Office, the disclosure of which is incorporated by reference herein in its entirety.

TECHNICAL FIELD

The present inventive concept relates to a transporting system and a transporting unit included therein.

DISCUSSION OF THE RELATED ART

A transporting system including an automatically controlled transporting unit may be used to load and transport parts or completed products during a manufacturing process.

One or more transporting units may move along rails of the transporting system installed in a semiconductor manufacturing factory. Two rails of the transporting system on which the one or more transporting units travel may merge at a merging location. However, when a plurality of transporting units travel on the two rails, the transporting units may collide with each other at the merging location.

SUMMARY

According to an exemplary embodiment of the present inventive concept, a transporting system includes a first rail including a first region and a second region, the first region being a region where the first rail extends linearly and the second region being a region where the first rail is curved. A second rail includes a third region, separated from the first region, and a fourth region overlapping the second region, wherein the first and second rails merge at a joining location that includes the second region and the fourth region. Optical lines are disposed in the second region and the fourth region, wherein the optical lines are parallel to each other in the fourth region. A first transporting unit travels on the first rail. A second transporting unit travels on the second rail. A first controller controls the traveling of the first and second transporting units using light transmitted or received through the optical lines.

In an exemplary embodiment of the present inventive concept, the optical lines include first and second optical lines disposed along the third region and separated from each other, and third and fourth optical lines disposed along the fourth region and separated from each other.

In an exemplary embodiment of the present inventive concept, when the first transporting unit enters the second region at a first time and the second transporting unit enters the fourth region at a second time later than the first time, the first controller supplies the third optical line with a stop signal.

In an exemplary embodiment of the present inventive concept, the transporting system further includes a third transporting unit traveling on the first rail, wherein when the third transporting unit enters the second region at a third time between the first time and the second time, wherein the first controller supplies the third optical line with the stop signal until the third transporting unit exits the second region.

In an exemplary embodiment of the present inventive concept, the first transporting unit supplies the first controller with a first entrance signal through the second optical line when it enters the second region, and the second transporting unit supplies the first controller with a second entrance signal through the fourth optical line when it enters the fourth region.

In an exemplary embodiment of the present inventive concept, before supplying the first controller with the first and second entrance signals, the first transporting unit supplies the first controller with a first reference signal to be synchronized with the first controller and the second transporting unit supplies the first controller with a second reference signal to be synchronized with the first controller.

In an exemplary embodiment of the present inventive concept, when the first and second entrance signals are simultaneously supplied, the first controller simultaneously supplies the first and third optical lines with a stop signal and controls the first and second transporting units to sequentially resume traveling.

In an exemplary embodiment of the present inventive concept, the first controller includes a first interface board connected to the first and second optical lines, and a second interface board connected to the third and fourth optical lines. The first interface board includes a first transmitting unit supplying the first optical line with an optical signal and a first receiving unit receiving an optical signal supplied from the second optical line, and the second interface board includes a second transmitting unit supplying the third optical line with an optical signal and a second receiving unit receiving an optical signal supplied from the fourth optical line.

In an exemplary embodiment of the present inventive concept, the first transporting unit includes a second controller disposed in the first transporting unit and the second transporting unit includes a third controller disposed in the second transporting unit.

In an exemplary embodiment of the present inventive concept, the optical lines include a first optical line disposed along the second region and a second optical line disposed along the fourth region, and the second controller supplies the first optical line with a first travel signal when the first transporting unit enters the second region.

In an exemplary embodiment of the present inventive concept, when the third controller enters the fourth region, the third controller determines whether the second transporting unit travels in the fourth region based on whether the first travel signal is received.

In an exemplary embodiment of the present inventive concept, each of the first and second transporting units includes a transmitting unit and a receiving unit which overlaps the optical lines.

In an exemplary embodiment of the present inventive concept, the transporting system further includes a cover disposed on the optical lines, wherein the cover faces the transmitting unit and the receiving unit of the first transporting unit, wherein the cover reflects a first optical signal emitted from the transmitting unit of the first transporting unit onto a surface of a first optical line of the optical lines disposed between the cover and the transmitting unit of the first transporting unit.

According to an exemplary embodiment of the present inventive concept, a transporting unit includes a support unit supporting a target object. A driving unit generates a driving force to transport the target object. A receiving unit receives a first optical signal emitted from a surface of a first optical line. A transmitting unit emits a second optical signal onto a surface of a second optical line that is spaced apart from the first optical line. A controller controls the driving unit using the first and second optical signals.

In an exemplary embodiment of the present inventive concept, the first optical line and the receiving unit overlap each other, and the second optical line and the transmitting unit overlap each other.

According to an exemplary embodiment of the present inventive concept, a transporting system includes a first rail having a first region and a second region. A second rail has a third region and a fourth region, wherein the second and fourth regions overlap each other, and the first and second rails merge at a joining location that is within the second and fourth regions. A first transporting unit is configured to travel on the first rail. A second transporting unit is configured to travel on the second rail. A first optical line and a second optical line are disposed within the second region. A third optical line and a fourth optical line are disposed within the fourth region. A first controller is connected to the first, second, third, and fourth optical lines, wherein the first controller is configured to control the traveling of the first and second transporting units at the joining location through the first, second, third, and fourth optical lines.

In an exemplary embodiment of the present inventive concept, the first and second transporting units travel through the joining location at different times.

In an exemplary embodiment of the present inventive concept, the first controller communicates with the first transporting unit through the first and second optical lines, and the first controller communicates with the second transporting unit through the third and fourth optical lines.

In an exemplary embodiment of the present inventive concept, when the second transporting unit enters the joining location at a first time and the first transporting unit enters the joining location at a second time later than the first time, the second transporting unit travels through the joining location first, and the first transporting unit is supplied by the first controller with a stop signal through the first optical line while the second transporting unit passes through the joining location, wherein the first transporting system does not travel through the joining location while being supplied with the stop signal.

In an exemplary embodiment of the present inventive concept, after the second transporting unit exits the joining location, the first controller stops supplying the first transporting unit with the stop signal, and the first transporting unit begins traveling through the joining location.

BRIEF DESCRIPTION OF THE DRAWINGS

The above and other features and aspects of the present inventive concept will become more apparent by describing in detail exemplary embodiments thereof with reference to the following drawings, in which:

FIG. 12 is a diagram illustrating a transporting system according to an exemplary embodiment of the present inventive concept.

DETAILED DESCRIPTION OF THE EMBODIMENTS

Figure 1:
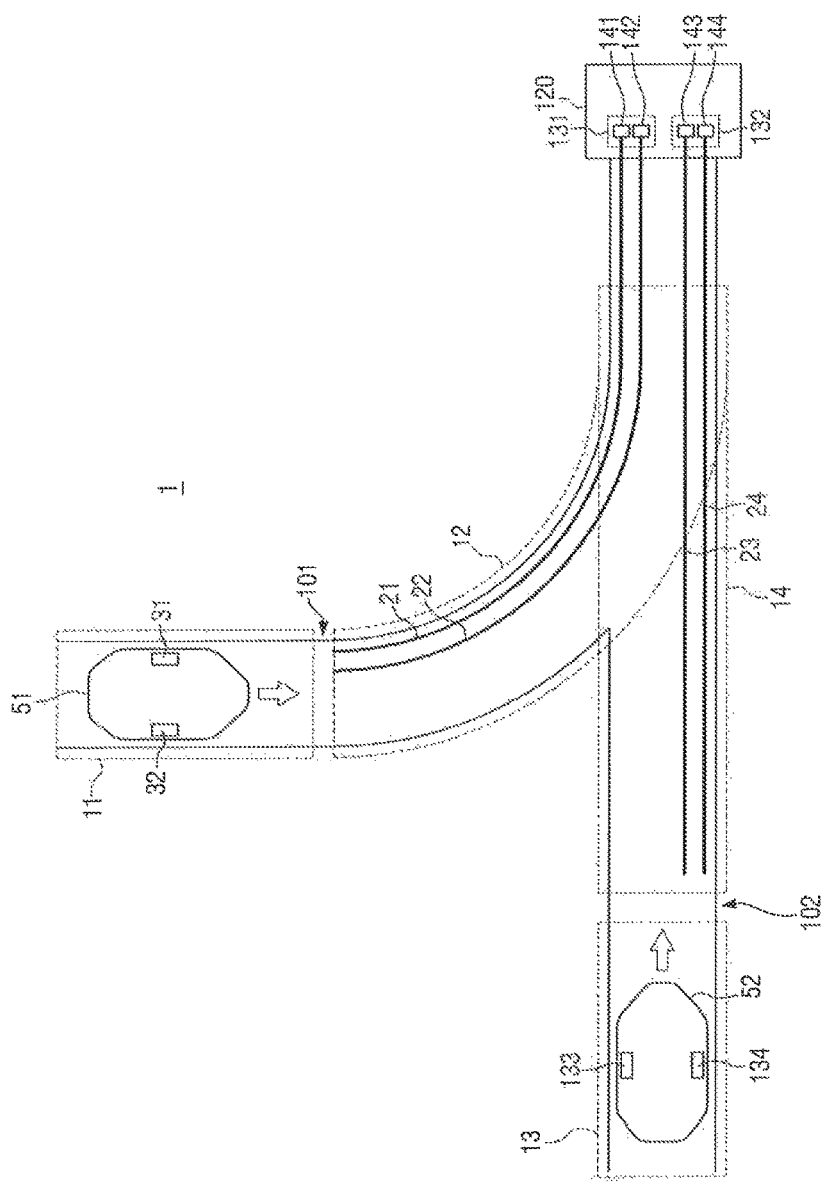
FIG. 1 is a diagram illustrating a transporting system according to an exemplary embodiment of the present inventive concept.

Aspects and features of the present inventive concept will become more apparent by describing in detail exemplary embodiments thereof with reference to the accompanying drawings. The present inventive concept may, however, be embodied in many different forms and should not be construed as being limited to the exemplary embodiments thereof set forth herein. The disclosed exemplary embodiments of the present inventive concept are provided to convey the inventive concept to those skilled in the art. In the drawings, the thickness of layers and regions may be exaggerated for clarity.

It will be understood that when an element or layer is referred to as being "on" or "connected to" another element or layer, it may be directly on or connected to the other element or layer or intervening elements or layers may be present. Like numbers may refer to like elements throughout the specification. As used herein, the term "and/or" may include any and all combinations of one or more of the associated listed items.

The terms "a" and "an" and "the" and similar referents may be construed to cover both the singular and the plural, unless otherwise indicated herein or the context clearly indicates otherwise.

The present inventive concept may be described with reference to perspective views, cross-sectional views, and/or plan views, in which exemplary embodiments of the inventive concept are shown. Thus, the profile view of an exemplary embodiment of the present inventive concept may be modified according to manufacturing techniques and/or allowances. Accordingly, the inventive concept may include all changes and modifications that may occur due to a manufacturing process or a change in the manufacturing process. Thus, regions and the shapes of the regions shown in the drawings are illustrative and do not limit the present inventive concept.

Unless defined otherwise, all technical and scientific terms used herein have the same meaning as that commonly understood by one of ordinary skill in the art. Further, all terms defined in generally used dictionaries need not be interpreted in an overly formal sense unless expressly so stated herein.

Hereinafter, a transporting system, according to an exemplary embodiment of the present inventive concept, will be described with reference to FIG. 1.

FIG. 1 is a diagram illustrating a transporting system according to an exemplary embodiment of the present inventive concept.

Referring to FIG. 1, the transporting system 1 includes a first rail 101, a second rail 102, first to fourth optical lines 21 to 24, first and second transporting units 51 and 52 and a controller 120.

The first and second rails 101 and 102 may be merged so an object being transported on the first and second rails 101 and 102 may continue to be transported through a rail that results from merging the first and second rails 101 and 102.

The first rail 101 may include a first region 11 and a second region 12 separated from each other. The second rail 102 may include a third region 13 and a fourth region 14 separated from each other. The first region 11 may be a region of the first rail 101 that extends linearly. The second region 12 may be a region of the first rail 101 in which the first rail 101 extends in a predetermined curvature. For example, according to an exemplary embodiment of the present inventive concept, the first rail 101 is curved in the second region 12.

The first rail 101 and the second rail 102 may be disposed to join each other at a joining area. The joining area may be referred to as a joining location. The joining area is a region where the separately extending first and second rails 101 and 102 merge and includes a portion of the second region 12 of the first rail 101 and a portion of the fourth region 14 of the second rail 102. For example, a plurality of rails may merge in the joining area to then extend as a single rail. In an exemplary embodiment of the present inventive concept, the first and second rails 101 and 102 merge in the joining area to extend as a single rail.

The first rail 101 and the second rail 102 may include the first region 11 and the third region 13, respectively, which are separate from each other.

In addition, the first rail 101 and the second rail 102 may be disposed to join each other at the second region 12 and the fourth region 14. For example, a portion of the second region 12 of the first rail 101 and a portion of the fourth region 14 of the second rail 102 may overlap each other.

The first transporting unit 51 and the second transporting unit 52 may travel on the first rail 101 and the second rail 102, respectively. Configurations of the first and second transporting units 51 and 52 will be described in detail below.

The first to fourth optical lines 21 to 24 may be disposed on the first rail 101 and the second rail 102. In an exemplary embodiment of the present inventive concept, the first to fourth optical lines 21 to 24 may be disposed along the joining area of the first and second rails 101 and 102 without being disposed in other regions.

For example, the first and second optical lines 21 and 22 may be disposed to extend in the second region 12 of the first rail 101 without being disposed in the first region 11. In addition, the third and fourth optical lines 23 and 24 may be disposed to extend in the fourth region 14 of the second rail 102 without being disposed in the third region 12. In an exemplary embodiment of the present inventive concept, a first portion of the first and second optical lines 21 and 22, corresponding to the second region 12, may be curved. The curved first and second optical lines 21 and 22 may be equally distant from each other. In addition, a second portion of the first and second optical lines 21 and 22, corresponding to the second region 12, may be straight, and the straight first and second optical lines 21 and 22 may be parallel to each other. In an exemplary embodiment of the present inventive concept, the third and fourth optical lines 23 and 24 may be straight and parallel to each other.

When the first and second optical lines 21 and 22 are disposed to extend in the second region 12 of the first rail 101 and the first transporting unit 51 enters the joining area of the first rail 101 and the second rail 102, the first transporting unit 51 may use the first and second optical lines 21 and 22 to communicate with the controller 120. For example, when the first transporting unit 51 exits the first region 11 to then enter the second region 12, a transceiving unit 31 of the first transporting unit 51 may start communication with the controller 120 through the first and second optical lines 21 and 22.

When the first transporting unit 51 exits the second region 12 of the first rail 101, the first transporting unit 51 is disconnected from the first and second optical lines 21 and 22. Accordingly, communication between the first transporting unit 51 and the controller 120 through the first and second optical lines 21 and 22 may be terminated.

When the third and fourth optical lines 23 and 24 are disposed in the fourth region 14 of the second rail 102 and the second transporting unit 52 enters the joining area of the first and second rails 101 and 102, the second transporting unit 52 may use the third and fourth optical lines 23 and 24 to communicate with the controller 120. Like the first transporting unit 51, when the second transporting unit 52 enters the fourth region 14 of the second rail 102, the second transporting unit 52 may start communication with the controller 120 using the third and fourth optical lines 23 and 24.

In addition, communication between the second transporting unit 52 and the controller 120, using the third and fourth optical lines 23 and 24, may be terminated when the second transporting unit 52 exits the fourth region 14.

As described above, since the first to fourth optical lines 21 to 24 are disposed on the joining area of the first and second rails 101 and 102, for example, the second and fourth regions 12 and 14, the first and second transporting units 51 and 52 may communicate with the controller 120 using the first to fourth optical lines 21 to 24 in the joining area of the first and second rails 101 and 102. Therefore, the controller 120 may determine whether the first and second transporting units 51 and 52 enter or exit the joining area based on communication states of the first and second transporting units 51 and 52.

In addition, when the first to fourth optical lines 21 to 24 are disposed on the second and fourth regions 12 and 14, but the first to fourth optical lines 21 to 24 are not disposed throughout the entire area of the transporting system 1 (e.g., the first to fourth optical lines 21 to 24 are disposed on the second and fourth regions 12 and 14 but the first to fourth optical lines 21 to 24 are not disposed on the first and third regions 11 and 13), system complexity and maintenance and repair difficulty may be reduced.

Optical communications between the first and second transporting units 51 and 52 and the controller 120 using the first to fourth optical lines 21 to 24 will be described in detail below.

The controller 120 may include first and second interface boards 131 and 132. The first interface board 131 may include a first transmitting unit 141 and a first receiving unit 142. The first interface board 131 connected to the controller 120 may communicate with the first transporting unit 51 using the first transmitting unit 141 and the first receiving unit 142.

In addition, the second interface board 132 may communicate with the second transporting unit 52 through a second transmitting unit 143 and a second receiving unit 144 connected to the third and fourth optical lines 23 and 24.

Figure 2:
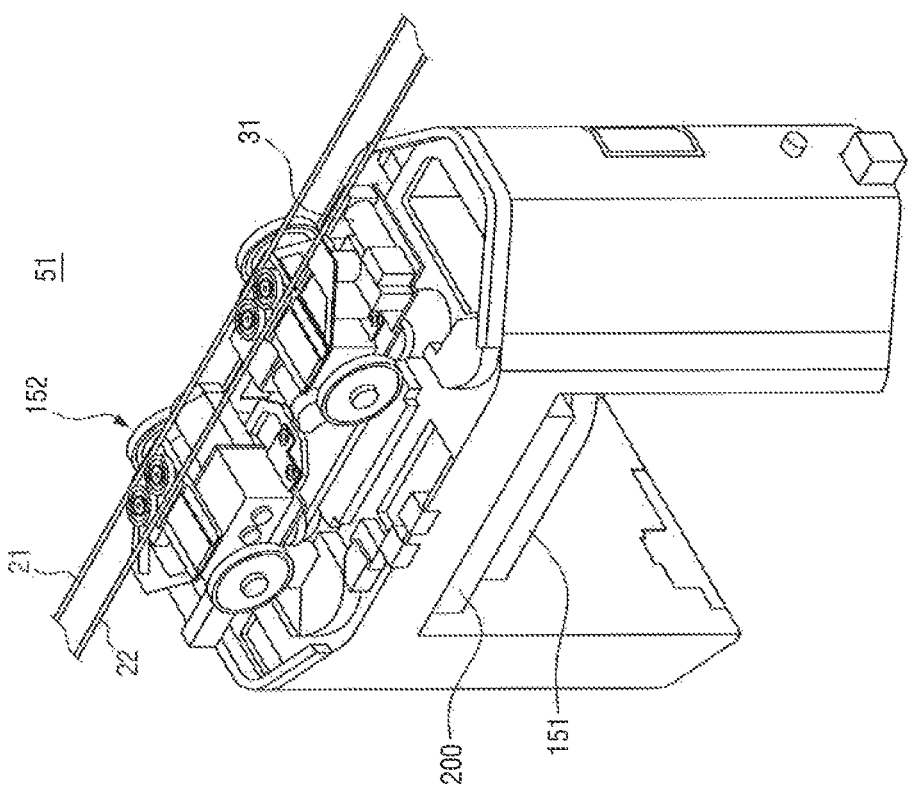
FIG. 2 is a perspective view illustrating a transporting unit according to an exemplary embodiment of the present inventive concept.
Figure 3:
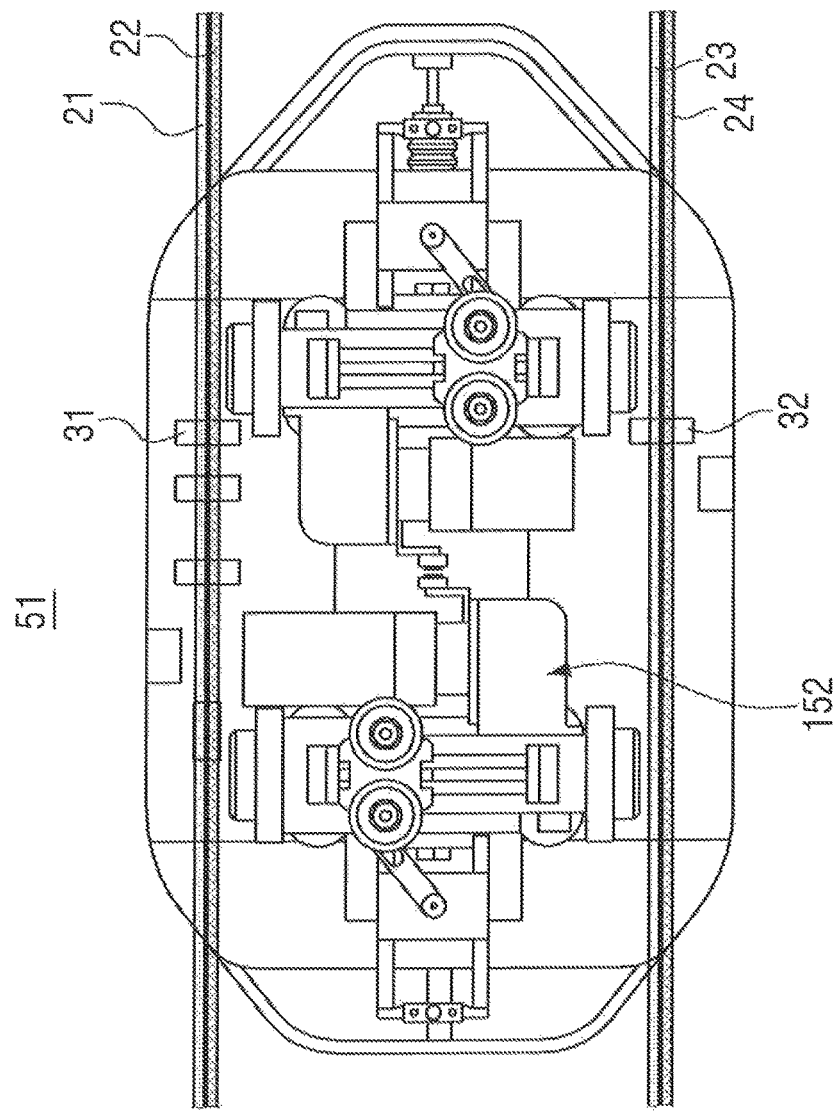
FIG. 3 is a top view illustrating the transporting unit shown in FIG. 2, according to an exemplary embodiment of the present inventive concept.

FIG. 2 is a perspective view of a transporting unit according to an exemplary embodiment of the present inventive concept. FIG. 3 is a top view of the transporting unit shown in FIG. 2, according to an exemplary embodiment of the present inventive concept.

Referring to FIGS. 2 and 3, the first transporting unit 51 may include a support unit 151 supporting a target object, a driving unit 152 generating a driving force to transport the target object, and the transceiving unit 31 optically communicating with the controller 120 through the first and second optical lines 21 and 22.

The shape of the first transporting unit 51 shown in FIG. 2 is provided only for illustration, but aspects of the present inventive concept are not limited thereto. For example, since the driving unit 152 is disposed under the first transporting unit 51 shown in FIG. 2, the first transporting unit 51 is suspended from the first rail 101 and travels in such a state.

However, in an exemplary embodiment of the present inventive concept, the driving unit 152 may be disposed on the first transporting unit 51, and the first transporting unit 51 may travel on the first rail 101.

The target object transported by the first transporting unit 51 may be loaded on the support unit 151 and is supported by the support unit 151.

The transceiving unit 31, which is positioned to vertically overlap the first and second optical lines 21 and 22, receives an optical signal emitted from the first optical line 21 and emits an optical signal into the second optical line 22.

The first to fourth optical lines 21 to 24 may be optical lines having side emitting characteristics. For example, side surfaces or an exterior surface of each of the first to fourth optical lines 21 to 24 may be transparent and may have light-permeating characteristics. Thus, optical signals may be read from exterior surfaces of the first to fourth optical lines 21 to 24, respectively, and optical signals may be entered into the first to fourth optical lines 21 to 24 through the exterior surfaces of the first to fourth optical lines 21 to 24.

The first to fourth optical lines 21 to 24 may be formed of a collection of optical fibers having side emitting characteristics, but aspects of the present inventive concept are not limited thereto. The first to fourth optical lines 21 to 24 may constitute a single cable having a transparent cylindrical exterior surface.

The first to fourth optical lines 21 to 24 may be made of a plastic material having good bendability. For example, the first and second rails 101 and 102 may be disposed in the first to fourth regions 11 to 14 in curved shapes. Therefore, to curve the first to fourth optical lines 21 to 24 along the curved first and second rails 101 and 102, the first to fourth optical lines 21 to 24 may include a material that can be deformed. For example, the first to fourth optical lines 21 to 24 may include a flexible material.

Since the first to fourth optical lines 21 to 24 use side emitting characteristics for transmitting information, optical signals transmitted through the first to fourth optical lines 21 to 24 may have weaker intensities toward their terminals. Therefore, the first to fourth optical lines 21 to 24 may include optical repeaters for relaying optical signals between repeater sections of the first to fourth optical lines 21 to 24.

Figure 4:
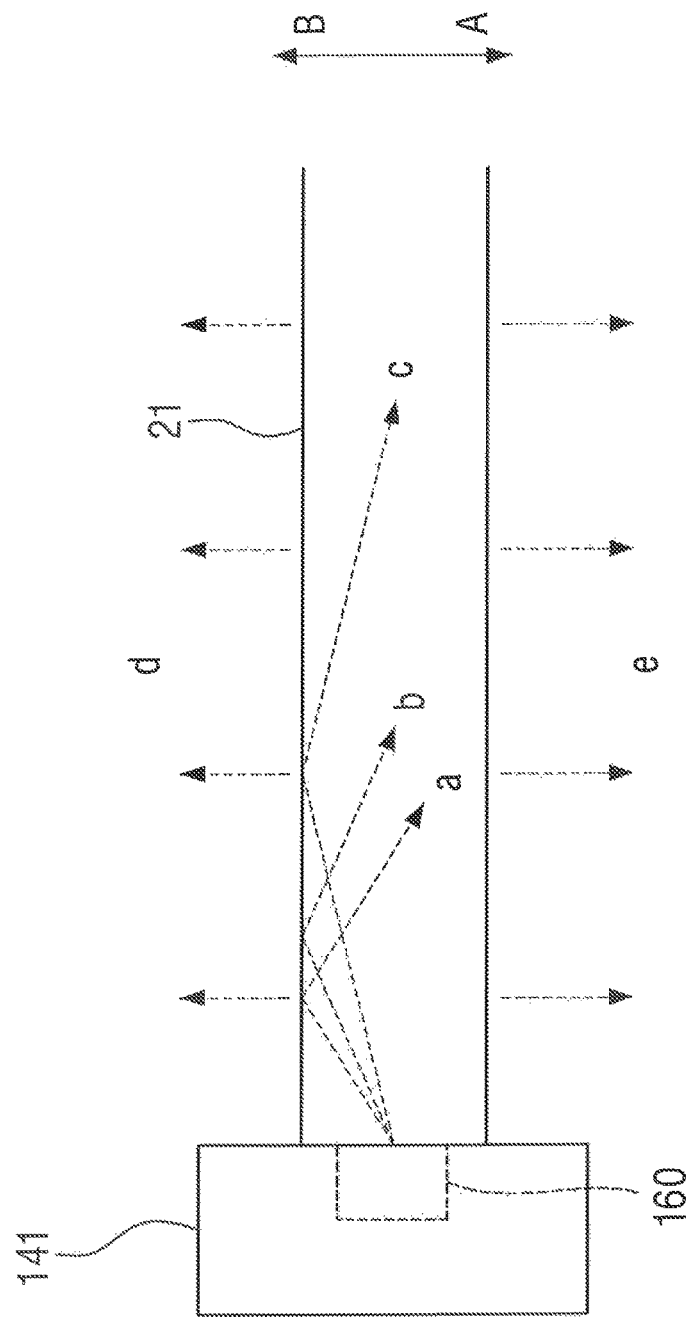
FIGS. 4 and 5 are sectional views illustrating portions of optical lines in a transporting system according to an exemplary embodiment of the present inventive concept.
Figure 5:
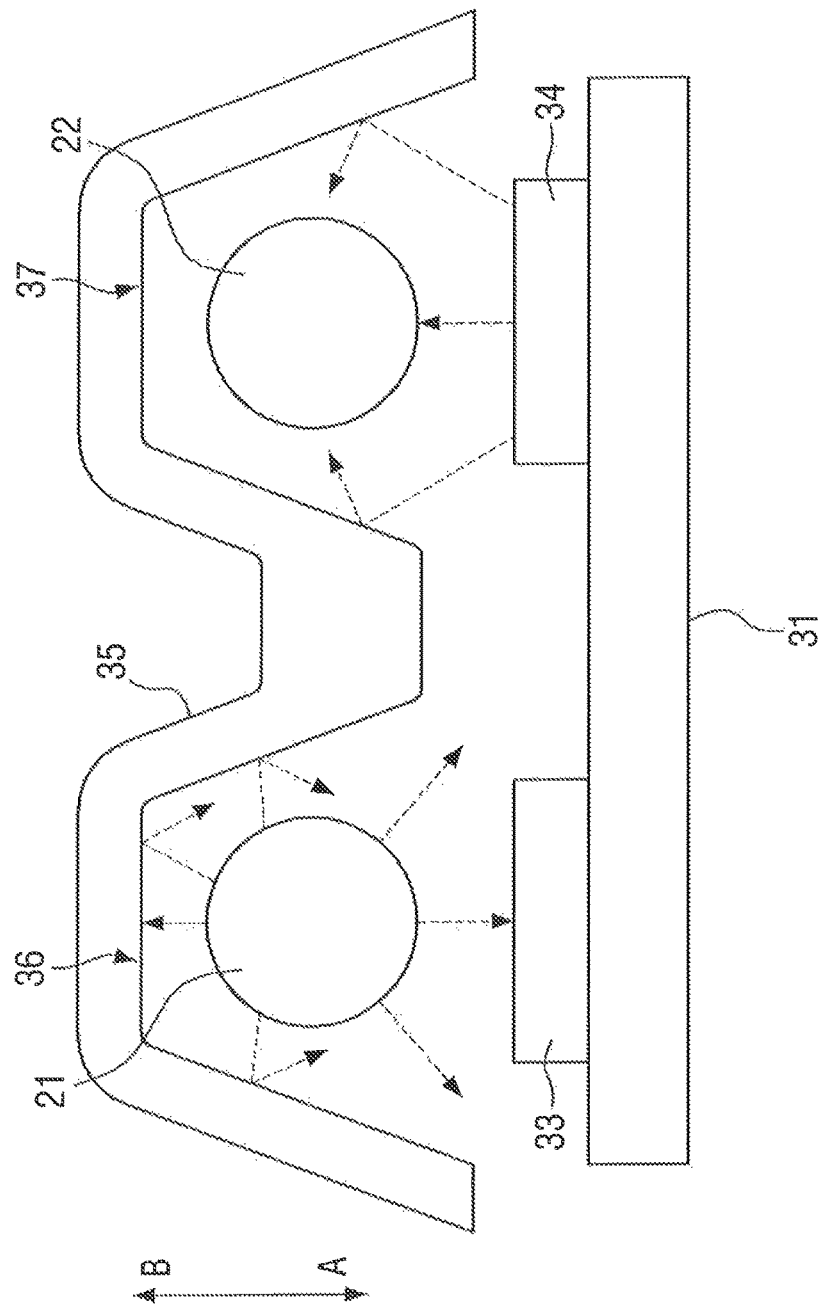

FIGS. 4 and 5 are sectional views illustrating portions of optical lines in a transporting system according to an exemplary embodiment of the present inventive concept.

Referring to FIGS. 4 and 5, in an exemplary embodiment of the present inventive concept, the first transporting unit 51 performs optical communication using the first and second optical lines 21 and 22 based on side emitting characteristics of the first and second optical lines 21 and 22. For example, as shown in FIGS. 4 and 5, the following description will be made on the assumption that the transceiving unit 31 of the first transporting unit 51 is disposed under the first and second optical lines 21 and 22.

For example, when an optical signal is incident to the first optical line 21 from the first transmitting unit 141 of the controller 120, some portions a, b and c of the optical signal are totally reflected on the inside of the first optical line 21, and the remaining portions d and e of the optical signal may be emitted by lower and upper side surfaces A and B of the first optical line 21, respectively.

The optical signal (e.g., the portion e of the optical sign) emitted to the lower side surface A of the first optical line 21 may be received by the transceiving unit 31 of the first transporting unit 51. For example, the portion e of the optical signal emitted to the lower side surface A of the first optical line 21 may be received by a receiving unit 33 included in the transceiving unit 31.

In an exemplary embodiment of the present inventive concept, the receiving unit 33 may include a photo diode, but aspects of the present inventive concept are not limited thereto.

The transmitting of the optical signal to the controller 120 through the second optical line 22 may be performed by a transmitting unit 34 included in the transceiving unit 31. The transmitting unit 34 emits the optical signal onto a lower side surface of the second optical line 22.

The optical signal emitted by the transmitting unit 34 is incident to a lower side surface of the second optical line 22 and enters the second optical line 22 through the lower side surface of the second optical line 22. Having entered the second optical line 22, the optical signal may be transmitted through the second optical line 22 to the first receiving unit 142 of the controller 120.

Since the side surfaces of the first and second optical lines 21 and 22 are both made of light-permeating materials, the light emitted to the side surface of the first optical line 21 may enter the first optical line 21 and travel through the first optical line 21 toward the upper side surface B of the first optical line 21.

In addition, the optical signal emitted by the transmitting unit 34 onto the lower side surface of the second optical line 22 may interfere with the first optical line 21 or the receiving unit 33. Therefore, in order to avoid unwanted transmission of the optical signal, a cover 35 may be installed on the first and second optical lines 21 and 22.

The cover 35 covering top portions of the first and second optical lines 21 and 22 may prevent the optical signal from being dispersed or interfered in an unwanted direction. For example, internal sidewalls 36 and 37 of the cover 35, facing the cover 35 and the first and second optical lines 21 and 22, include reflective materials to reflect the light emitted from the upper side surfaces B of the first and second optical lines 21 and 22, respectively, back into the first and second optical lines 21 and 22.

Therefore, a portion of the optical signal emitted from the first optical line 21 is reflected by the internal sidewall 36 of the cover 35 back into the first optical line 21. For example, the portion of the optical signal reflected by the internal sidewall 36 of the cover 35 may be directed toward the lower side surface A of the first optical line 21 and enter the first optical line 21. Accordingly, a sensitivity of the optical signal received by the receiving unit 33 may be increased. In addition, the cover 35 may prevent the optical signal emitted from the first optical line 21 from causing interference to the second optical line 22.

A portion of the optical signal emitted from the transmitting unit 34 is reflected by the internal sidewall 37 of the cover 35 back into the second optical line 22. For example, the portion of the optical signal reflected by the internal sidewall 37 of the cover 35 may be directed toward the lower side surface A of the second optical line 22 and enter the second optical line 22. In addition, the cover 35 may prevent the optical signal emitted by the transmitting unit 34 toward the second optical line 22 from causing interference to the first optical line 21.

The first transmitting unit 141 may include an emitting diode emitting light into the first optical line 21. In addition, the first receiving unit 142 may include a photo diode for detecting the light that passes through the second optical line 22.

Referring again to FIGS. 2 and 3, the first transporting unit 51 may include a controller 200. The controller 200 may control traveling of the first transporting unit 51 based on the transmitting/receiving results of the transceiving unit 31 of the first transporting unit 51 using the first to fourth optical lines 21 to 24.

Figure 6:
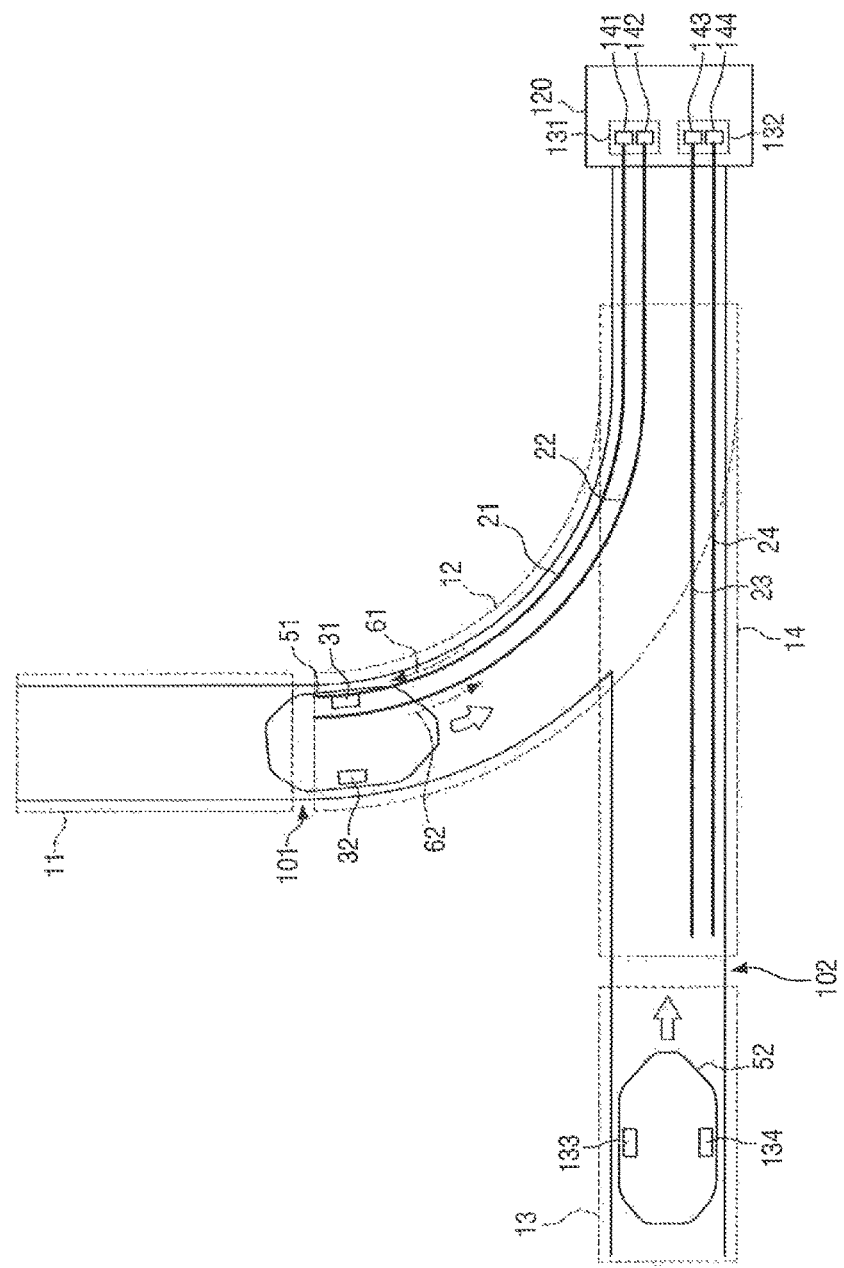
FIGS. 6 to 8 are diagrams illustrating an operating method of a transporting system according to an exemplary embodiment of the present inventive concept.
Figure 7:
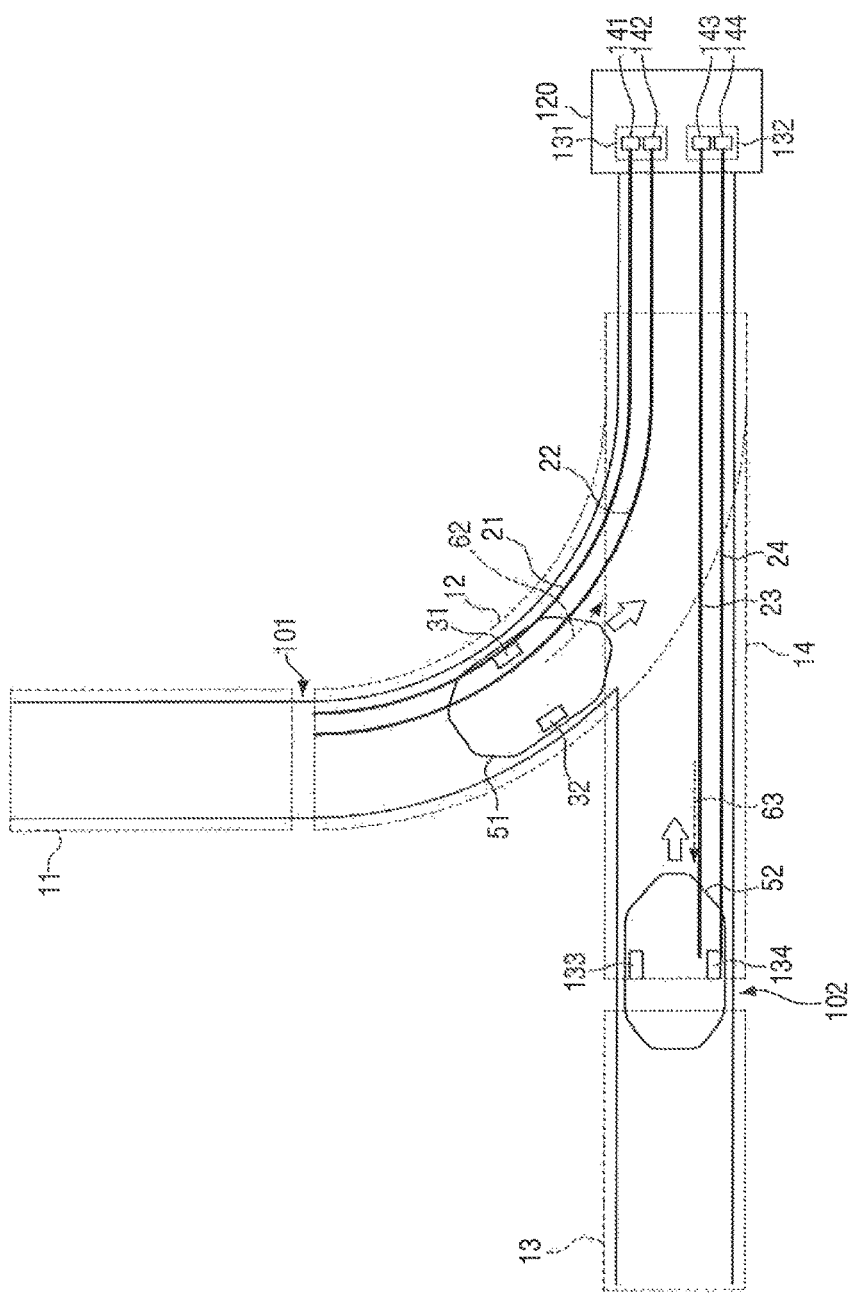
Figure 8:
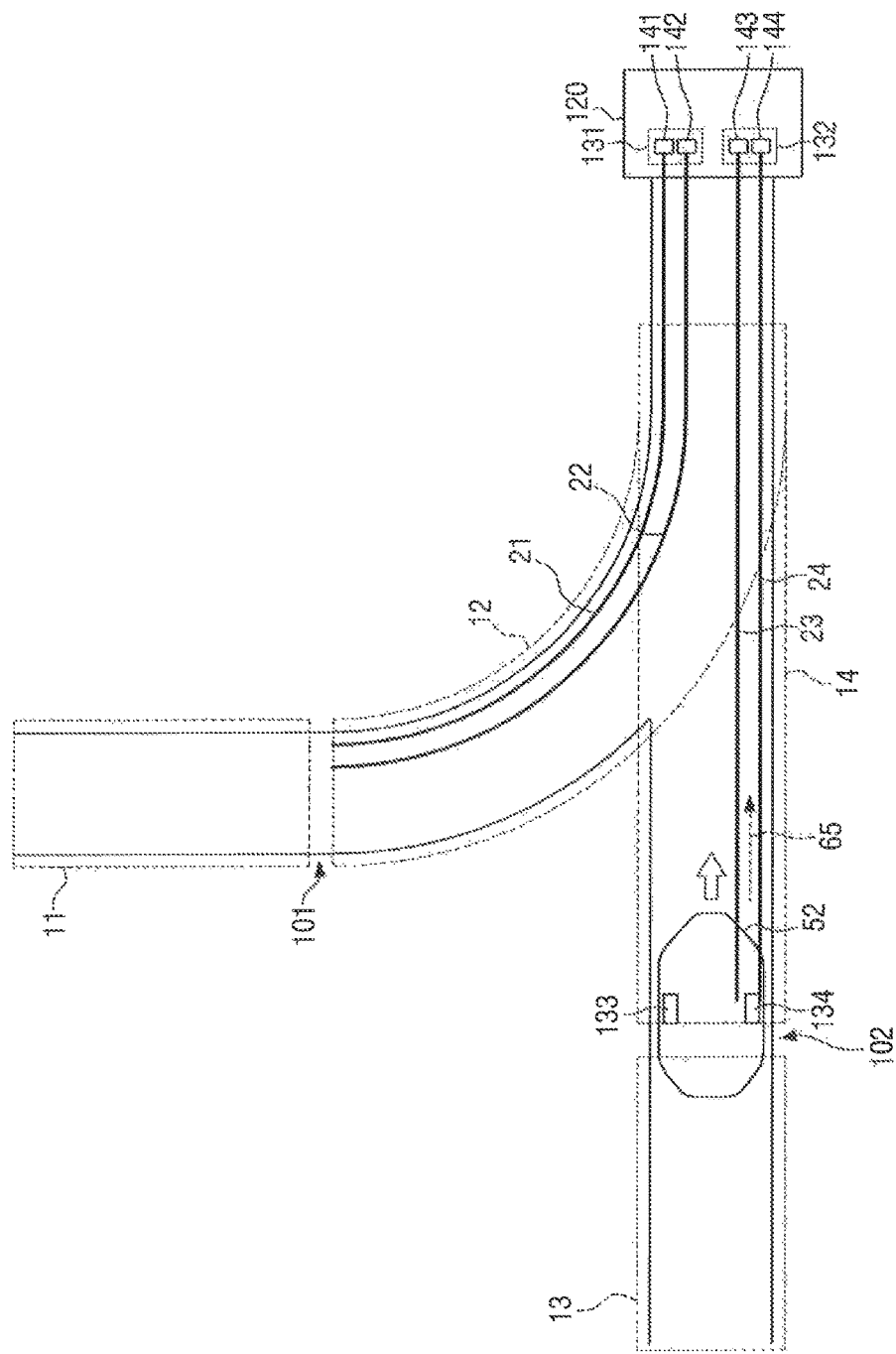

FIGS. 6 to 8 are diagrams illustrating an operating method of a transporting system according to an exemplary embodiment of the present inventive concept.

Referring to FIG. 6, the first transporting unit 51 traveling on the first rail 101 enters a joining area of the first rail 101 and the second rail 102, for example, the second region 12. At this time, the second transporting unit 52 is disposed in the third region 13, for example, the second transporting unit 52 has yet to enter the joining area of the first rail 101 and the second rail 102.

When the first transporting unit 51 enters the second region 12, communication between the first transporting unit 51 and the controller 120 may be started as described below.

When the first transporting unit 51 enters the second region 12, the transceiving unit 31 is disposed so as to overlap with the first and second optical lines 21 and 22. The receiving unit 33 may receive a first signal 61 from the first transmitting unit 141 of the controller 120. The transmitting of the first signal 61 by the first transmitting unit 141 of the controller 120 may be performed through the first optical line 21.

The first signal 61 is a signal for starting synchronization between the first transporting unit 51 and the controller 120 and may include a reference signal. The synchronization may indicate that communication periods of the first transporting unit 51 and the controller 120 are made to coincide with each other to start the communication therebetween.

When the communication between the controller 120 and the first transporting unit 51 using the reference signal is completed, the controller 120 and the first transporting unit 51 are connected to each other and a first travel signal 62 is transmitted from the first transporting unit 51 to the receiving unit 142 of the controller 120. The transmitting of the first travel signal 62 to the receiving unit 142 of the controller 120 by the first transporting unit 51 may be performed by transmitting the first travel signal 62 through the second optical line 22. The first travel signal 62 may also be referred to as a first entrance signal.

As described above, the communication between the first transporting unit 51 and the controller 120 using the first and second optical lines 21 and 22 may be performed using side or exterior surface emission characteristics of the first and second optical lines 21 and 22.

Since the second transporting unit 52 is yet to enter the joining area of the first rail 101 and the second rail 102 and is still traveling on the third region 13, communication between the second transporting unit 52 and the controller 120 has not started.

Referring to FIG. 7, the second transporting unit 52 enters the joining area of the first rail 101 and the second rail 102 later than the first transporting unit 51. For example, the second transporting unit 52 may exit the third region 13 to then enter the fourth region 14.

Since a fourth transceiving unit 134 of the second transporting unit 52 is disposed so as to overlap with the third and fourth optical lines 23 and 24, the communication between the second transporting unit 52 and the controller 120 may be started.

When the second transporting unit 52 enters the fourth region 14, a receiving unit of the fourth transceiving unit 134 of the second transporting unit 52 may receive a second signal 63 through the third optical line 23. The second signal 63 may be a signal for starting synchronization between the second transporting unit 52 and the controller 120 and may include a reference signal. The synchronization may indicate that communication periods of the second transporting unit 52 and the controller 120 are made to coincide with each other to start the communication therebetween.

When the communication between the controller 120 and the second transporting unit 52 using the reference signal is completed, the controller 120 and the second transporting unit 52 are connected to each other and a second travel signal 65 may be transmitted to the second receiving unit 144 of the controller 120 through the fourth optical line 24. The second travel signal 65 may also be referred to as a second entrance signal.

A second transmitting unit 143 of the controller 120 may supply the second transporting unit 52 with the second signal 63 through the third optical line 23. Here, the second signal 63 supplied from the second transmitting unit 143 of the controller 120 may be the first travel signal 62 supplied from the first transporting unit 51. For example, the first travel signal 62 supplied from the first transporting unit 51 may be supplied to the second transporting unit 52 without being separately processed.

When the second transporting unit 52 is supplied with the second signal 63 from the controller 120, it may recognize the supplied second signal 63 as a stop signal and the second transporting unit 52 is stopped front traveling on the second rail 102.

When the second transporting unit 52 enters the joining area of the first rail 101 and the second rail 102 in a state in which the traveling of the second transporting unit 52 on the second rail 102 is not controlled, the second transporting unit 52 may collide with the first transporting unit 51 which has entered the joining area earlier than the second transporting unit 52.

Therefore, the controller 120 recognizes that the first transporting unit 51 enters the joining area of the first rail 101 and the second rail 102 and transfers the travel signal of the first transporting unit 51 to the second transporting unit 52 to make the second transporting unit 52 stop traveling. Traveling stability between the first and second transporting units 51 and 52 may be increased under the control of the controller 120.

Referring to FIG. 8, the first transporting unit 51 continues to travel along the joining area of the first rail 101 and the second rail 102 until it exits the joining area. Therefore, when the first transporting unit 51 exits the joining area of the first rail 101 and the second rail 102, the first transporting unit 51 stops supplying the first travel signal 62 to the controller 120. Accordingly, the controller 120 may stop supplying the stop signal 63 to the second transporting unit 52.

When the supplying of the stop signal 63 to the second transporting unit 52 is stopped, traveling of the second transporting unit 52 on the second rail 102 may be resumed. When the second transporting unit 52 enters and travels along the joining area of the first rail 101 and the second rail 102, the second travel signal 65 may be transmitted to the fourth optical line 24. When another transporting unit enters the second region 12, the second transporting unit 52 may be notified to avoid collision.

The driving unit (e.g., the driving unit 152 shown in FIG. 2) of each of the first and second transporting units 51 and 52 may be controlled using the travel signal and the stop signal transmitted/received by the transceiving units 31, 32, 133 and 134. The controlling of the driving unit 152 may be performed by the controller (e.g., the controller 200 shown in FIG. 2) of the first and second transporting units 51 and 52. The driving unit (e.g., the driving unit 152 shown in FIG. 2) of each of the first and second transporting units 51 and 52 may control the traveling of the first and second transporting units 51 and 52 on the first and second rails 101 and 102.

According to an exemplary embodiment of the present invention, the second transporting unit 52 may enter the joining area of the first rail 101 and the second rail 102 before the first transporting unit 51. In this case, after synchronizing the second signal 63 with the controller 120, the second transporting unit may start communication with the controller 120, transmit the second travel 65 to the controller 120, and travel through the joining area of the first rail 101 and the second rail 102. When the first transporting unit 51 enters the joining area of the first rail 101 and the second rail 102, the first transporting unit 51 may synchronize the first signal 61 with the controller 120 to begin communicating with the controller 120. In this case the first signal 61 supplied to the first transmitting unit 51 may be the second travel signal 65.

When the first transporting unit 51 is supplied with the first signal 61 from the controller 120, it may recognize the supplied first signal 61 as a stop signal and the first transporting unit 51 is stopped from traveling on the first rail 101.

The transporting system 1 controls traveling of the first and second transporting units 51 and 52 through the first to fourth optical lines 21 to 24 disposed on the joining area of the first rail 101 and the second rail 102. Accordingly, positions of the first and second transporting units 51 and 52 may be identified and traveling of the first and second transporting units 51 and 52 may be controlled throughout the entire joining area. Therefore, the operating reliability of the transporting system 1 may be increased.

Figure 9:
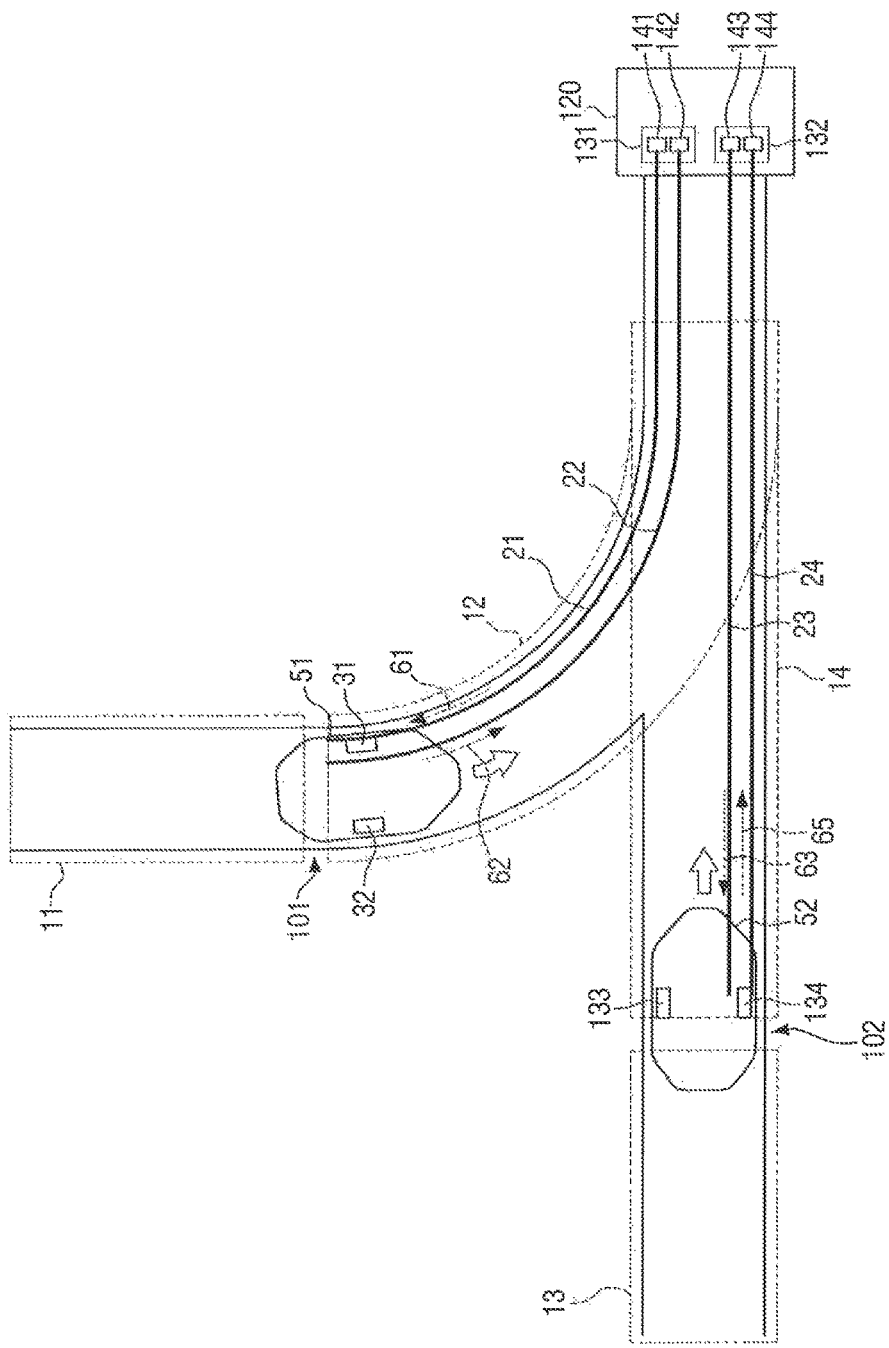
FIGS. 9 and 10 are diagrams illustrating an operating method of a transporting according to an exemplary embodiment of the present inventive concept.
Figure 10:
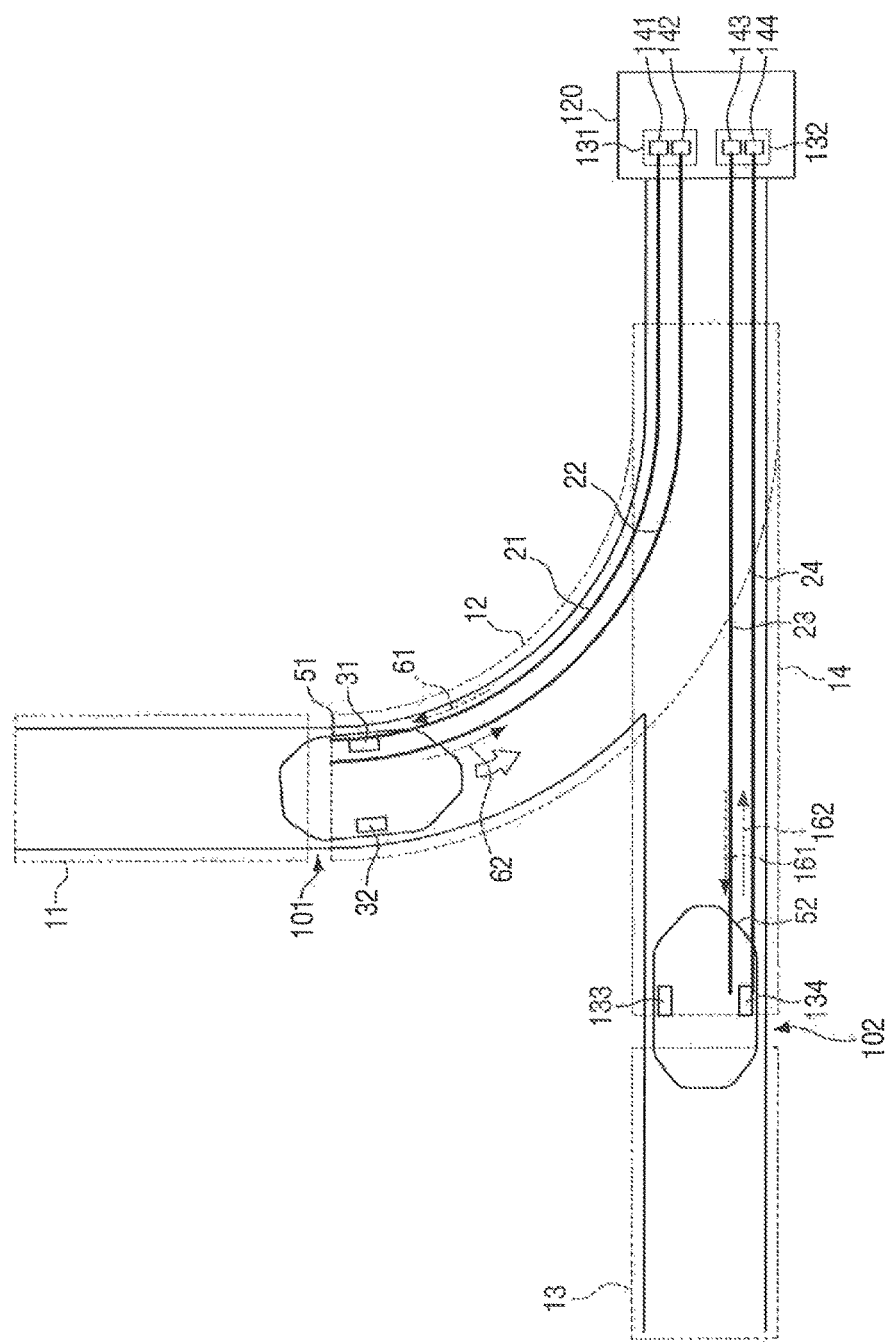

FIGS. 9 and 10 are diagrams illustrating an operating method of a transporting according to an exemplary embodiment of the present inventive concept.

Referring to FIG. 9, the first transporting unit 51 and the second transporting unit 52 may simultaneously enter the joining area of the first rail 101 and the second rail 102. For example, the first transporting unit 51 may enter the second region 12 at the same time that the second transporting unit 52 enters the fourth region 14.

The first and second transporting units 51 and 52 may receive first and second signals 61 and 63 from the first optical line 21 and the third optical line 23, respectively. Here, the first and second signals 61 and 63 may be reference signals for synchronizing the controller 120 with the first and second transporting units 51 and 52.

After being supplied with the first signal 61, the first transporting unit 51 may supply a first travel signal 62. At the same time, the second transporting unit 52 may supply the controller 120 with a second travel signal 65.

When the controller 120 is simultaneously supplied with the first and second travel signals 62 and 65, it may recognize that the first and second transporting units 51 and 52 simultaneously entered the joining area of the first rail 101 and the second rail 102, and may supply the first and second transporting units 51 and 52 with a stop signal. The first and second transporting units 51 and 52 may stop traveling immediately after receiving the stop signal.

Referring to FIG. 10, in order to resume the traveling of the first and second transporting units 51 and 52, the controller 120 may stop supplying the first transporting unit 51 with a stop signal 61. Accordingly, the first transporting unit 51 may resume traveling on the first rail 101. At the same time, the first transporting unit 51 may supply the second optical line 22 with a first travel signal 62.

Until the first transporting unit 51 completes traveling of the joining area of the first rail 101 and the second rail 102, the controller 120 may continue to supply the second transporting unit 52 with a stop signal 161. Therefore, the second transporting unit 52 may stop traveling until the first transporting unit 51 exits the second region 12.

Figure 11:
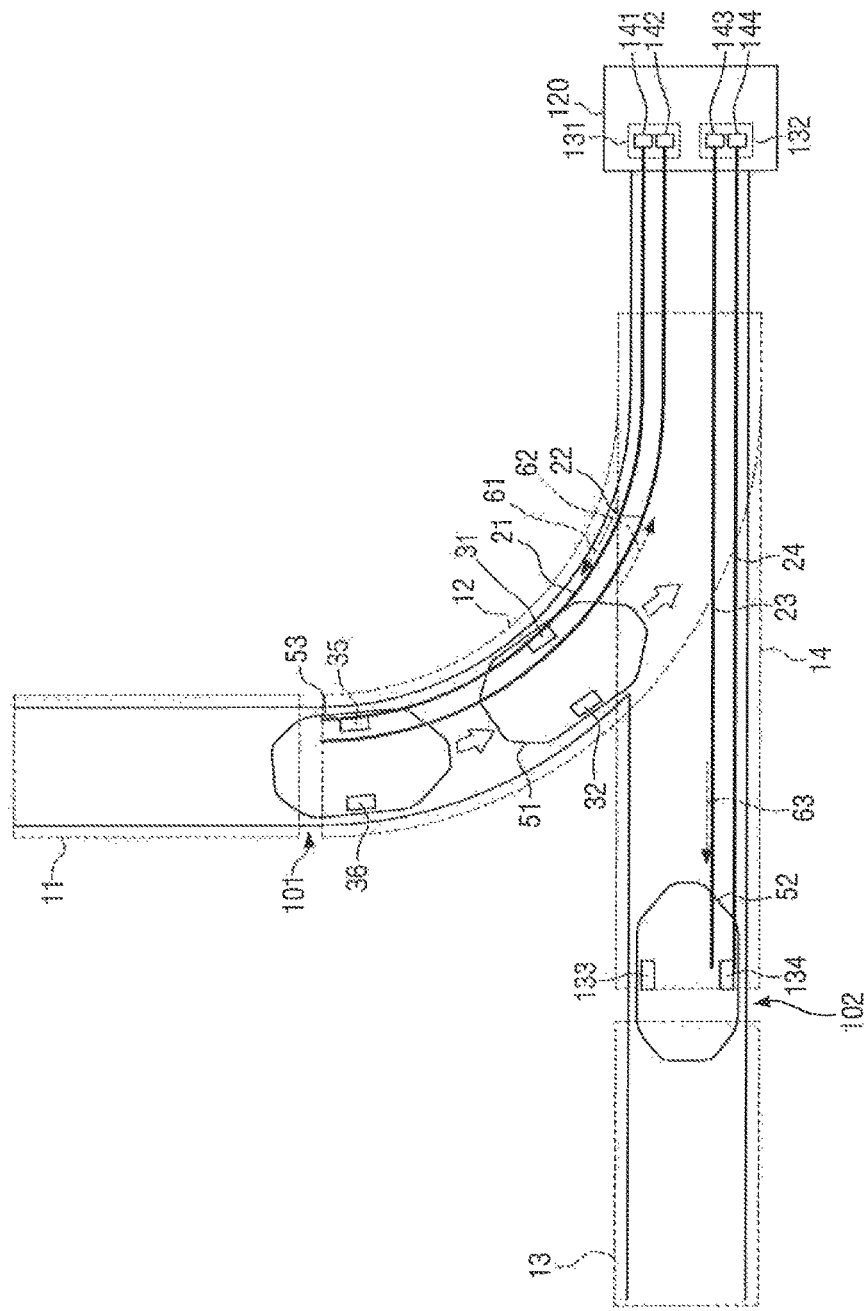
FIG. 11 is a diagram illustrating an operating method of a transporting according to an exemplary embodiment of the present inventive concept.

FIG. 11 is a diagram illustrating an operating method of a transporting according to an exemplary embodiment of the present inventive concept.

Referring to FIG. 11, the first transporting unit 51 may first enter the joining area of the first rail 101 and the second rail 102 and a third transporting unit 53 may then enter the joining area. For example, the first and third transporting units 51 and 53 may enter the joining area of the first rail 101 and the second rail 102 before the second transporting unit 52.

The first transporting unit 51 and the third transporting units 51 and 53 are supplied with a first signal 61 from the controller 120 and may travel on a first rail 101. Here, the first transporting unit 51 having first entered the second region 12 supplies a first travel signal 62. However, the third transporting unit 53 may not supply a separate travel signal because the second optical line 22 is used in transmitting/receiving the first travel signal 62.

At the same time when the second transporting unit 52 enters the fourth region 14, the second transporting unit 52 may be supplied with a second signal 63 from the controller 120. The second signal 63 may be the first travel signal 62 supplied from the first transporting unit 51, and the second transporting unit 52 supplied with the second signal 63 may stop traveling on the second rail 102. When the first transporting unit 51 exits the second region 12, the third transporting unit 53 is supplied with the first signal 61 from the controller 120 and supplies the controller 120 with the first travel signal 62. The second transporting unit 52 may be supplied with the second signal 63, which may be the first travel signal 62 supplied from the third transporting unit 53, to remain stopped. When the third transporting unit 53 exits the second region 12, the controller 120 may stop transmitting the second signal 63 to the second transporting unit 52 so the second transporting unit 52 may start traveling on the fourth region 14 of the second rail 102. For example, the second transmitting unit 143 supplies the third optical line 23 with the second signal 63 until the third transporting unit 53 exits the second region 12.

FIG. 12 is a diagram illustrating a transporting system according to an exemplary embodiment of the present inventive concept.

Referring to FIG. 12, the transporting system 2 may not include a controller 120 connected to first to fourth optical lines 21 to 24. Therefore, the first transporting unit 51 and the second transporting unit 52 may directly communicate with each other through the first to fourth optical lines 21 to 24.

For example, the first optical line 21 may be connected to the fourth optical line 24 and the second optical line 22 may be connected to the third optical line 23. If the first transporting unit 51 supplies a first travel signal 62 through the first optical line 21 while entering a second region, the first travel signal 62 may be emitted to a fourth region 14 through the fourth optical line 24. Conversely, if the second transporting unit 52 supplies a second travel signal 65 through the third optical line 23 while entering the fourth region 14, the second travel signal 65 may be emitted to the second region 12 through the second optical line 22.

When the controller (e.g., the controller 200 illustrated in FIG. 2) included in the first and second transporting units 51 and 52 is supplied with a travel signal from another transporting unit, it may make the first and second transporting units 51 and 52 stop traveling.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A transporting system comprising:
a transporting unit including a receiving unit; and
an optical line,
wherein the transporting unit is configured to move along the optical line disposed above the receiving unit while the receiving unit receives at least one optical signal emitted toward the receiving unit from a surface of the optical line, and
wherein the optical line includes an optical fiber having side emitting characteristics.

2. The transporting system of claim 1, wherein the at least one optical signal is emitted toward the receiving unit vertically with respect to an upper surface of the receiving unit.

3. The transporting system of claim 1, wherein the surface is a lower side surface of a half-circular portion of the optical line, the lower side being oriented toward the receiving unit.

4. The transporting system of claim 1, wherein the receiving unit is disposed on an upper surface of the transporting unit.

5. The transporting system of claim 1, wherein the receiving unit includes a photodiode.

6. The transporting system of claim 1, further comprising a cover covering at least a portion of the optical line to reflect another optical signal emitted from the surface of the optical line back into the optical line.

7. The transporting system of claim 1, wherein the optical line has light-permeating characteristics.

8. The transporting system of claim 1, wherein the optical line includes optical repeaters for relaying optical signals.

9. A transporting system comprising:
a transporting unit including a receiving unit;
an optical line; and
a controller where at least one optical signal is incident to the optical line from a first transmitting unit of the controller, thereby controlling a moving of the transporting unit,
wherein the transporting unit is configured to move along the optical line disposed above the receiving unit while the receiving unit receives the at least one optical signal emitted toward the receiving unit from a surface of the optical line.

10. The transporting system of claim 9, wherein the controller comprises a first transmitting unit having an emitting diode for emitting light into the optical line.

11. The transporting system of claim 9, wherein the at least one optical signal is emitted toward the receiving unit vertically with respect to an upper surface of the receiving unit.

12. The transporting system of claim 9, wherein the surface is a lower side surface of a half-circular portion of the optical line, the lower side being oriented toward the receiving unit.

13. The transporting system of claim 9, wherein the receiving unit is disposed on an upper surface of the transporting unit.

14. The transporting system of claim 9, wherein the receiving unit includes a photodiode.

15. The transporting system of claim 9, further comprising a cover covering at least a portion of the optical line to reflect another optical signal emitted from the surface of the optical line back into the optical line.

16. The transporting system of claim 9, wherein the optical line has light-permeating characteristics.

17. The transporting system of claim 9, wherein the optical line includes optical repeaters for relaying optical signals.

18. A transporting unit comprising:
a support unit configured to support a target object;
a driving unit configured to generate a driving force to transport the target object; and
a receiving unit configured to receive at least one optical signal emitted toward the receiving unit from a surface of an optical line that is to be disposed above the receiving unit when the transporting unit moves along the optical line,
wherein the optical line includes an optical fiber having side emitting characteristics.

19. The transporting unit of claim 18, wherein the receiving unit includes a photodiode.

* * * * *